United States Patent [19]

Lee

[11] Patent Number: 4,979,016

[45] Date of Patent: Dec. 18, 1990

[54] SPLIT LEAD PACKAGE

[75] Inventor: Robert D. Lee, Denton, Tex.

[73] Assignee: Dallas Semiconductor Corporation, Dallas, Tex.

[21] Appl. No.: 194,405

[22] Filed: May 16, 1988

[51] Int. Cl.$^5$ .................. H01L 23/48; H01L 29/44
[52] U.S. Cl. .................................. 357/70; 357/71; 357/74
[58] Field of Search .................. 357/70, 72, 74, 71

[56] References Cited

FOREIGN PATENT DOCUMENTS

| 0078448 | 5/1983 | Japan | 357/74 |
|---|---|---|---|
| 0222949 | 12/1984 | Japan | 357/74 |
| 0014460 | 1/1985 | Japan | 357/70 |
| 0018944 | 1/1985 | Japan | 357/70 |
| 0120056 | 6/1987 | Japan | 357/70 |
| 0177954 | 8/1987 | Japan | 357/74 |
| 0276255 | 11/1988 | Japan | 357/74 |
| 8605322 | 9/1986 | World Int. Prop. O. | 357/70 |

Primary Examiner—Rolf Hille
Assistant Examiner—Hoanganh Le
Attorney, Agent, or Firm—Worsham, Forsythe, Sampels & Wooldridge

[57] ABSTRACT

A multi-layer integrated circuit package uses split or bifurcated leads on separate levels, connected in parallel, for conducting the power supply voltages to an integrated circuit chip inside the package. The bifurcated leads are joined at the external pins of the package, and are split adjacent the die bond site of the package. The split ends provide separate power supply voltage conductors to the output driver circuitry on the integrated circuit chip and to the other circuitry in the integrated circuit chip. The effects of the transient currents induced in the power supply leads of the package are substantially isolated from the power supply voltages applied to the other circuitry of the integrated circuit chip.

8 Claims, 3 Drawing Sheets

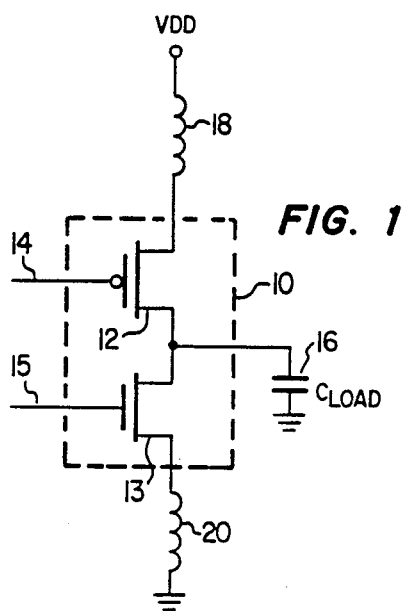
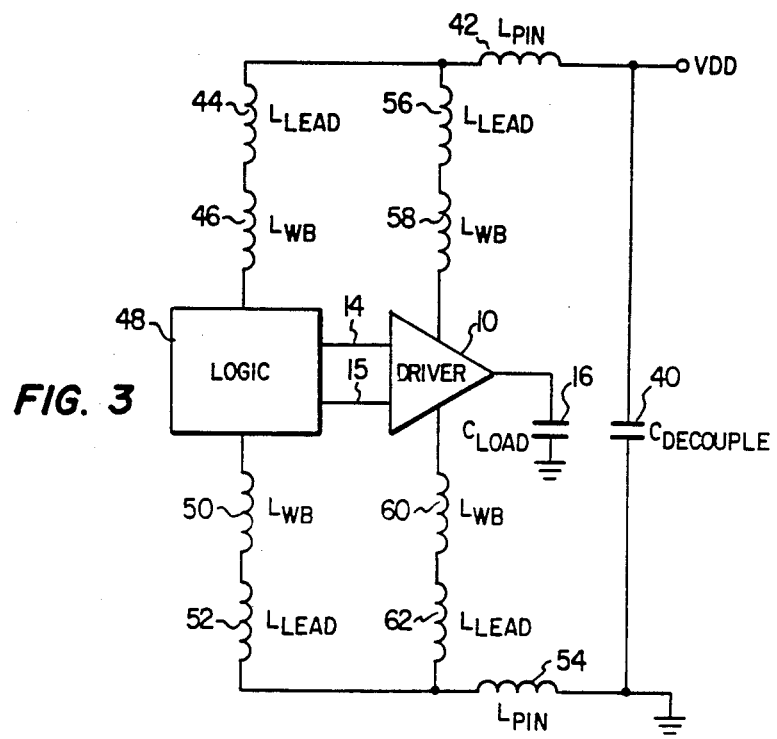

SPLIT LEAD PACKAGE

TECHNICAL FIELD

This invention relates to integrated circuits, and more particularly, to integrated circuit packages.

BACKGROUND OF THE INVENTION

Integrated circuit chips receive power supply voltages, usually VCC and ground, through conductors in an integrated circuit package. While the power supply voltage applied to the external pins of the integrated circuit package may be stable and within the stated tolerance, the voltages at the power supply pads of the integrated circuit chip, under certain conditions, may not be stable and may drop below the voltage at the power supply pins of the integrated circuit package due to the inductance present in the external pins, the internal leads of the integrated circuit package, and the wire bonds between the leads of the integrated circuit package and the pads of the integrated circuit chip.

For example, when the integrated circuit is providing several output signals into large capacitive loads and is driving these loads with fast rise and fall times, the current transients, di/dt, can be appreciable, exceeding an ampere of peak current. While the series inductance of the external pin, integrated circuit package leads, and wire bonds is relatively small, on the order of 5 to 15 nanohenries, the di/dt transients times the inductance can cause a voltage differential of several volts between the external pin of the integrated circuit package and the pads on the integrated circuit chip. The result is that the noise margins of the logic levels inside the integrated circuit chip is correspondingly reduced, and if the voltage transients are great enough, unwanted logic reversals may occur inside the integrated circuit chip.

In the past, these voltage transients have been held to a safe level by restricting the rise times and fall times of the output driver stages, thereby limiting the current transients. While limiting the rise and fall times reduces the voltage transients, it also directly affects the response time of the integrated circuit, which in many cases is a critical parameter in an electronic system.

The effects of the voltage transients have also to some extent been isolated from the logic circuitry by providing separate pads on the integrated circuit chip for the power supply voltages to the output driver stages and the power supply voltages to the rest of the integrated circuit chip containing the logic circuitry, and by providing separate wire bonds on each of these pads to the power supply leads in the integrated circuit package. While this isolates the voltage transients arising from the inductance of the wire bonds, the inductance of the wire bonds is only a fraction of the total inductance arising from the external pins, the leads in the integrated circuit package, and the wire bonds.

Therefore, it can be appreciated that an integrated circuit package which decreases the voltage transients of the power supply voltage to the logic circuitry of the integrated circuit to thereby permit faster rise and fall times and/or greater worst case noise margins is highly desirable.

SUMMARY OF THE INVENTION

It is, therefore, an object of this invention to provide an integrated circuit package which decreases the voltage transients arising from the inductance in integrated circuit packages as compared to prior art integrated circuit packages.

It is also an object of this invention to provide an integrated circuit package which permits integrated circuit chips to drive relatively large loads with relatively fast rise and fall times.

It is a further object of this invention to provide an integrated circuit package which gives rise to greater worst case noise margins within the logic circuitry of an integrated circuit chip in the integrated circuit package.

Shown in an illustrated embodiment of the invention is an integrated circuit package which has a plurality of leads, each extending from a like plurality of external pins to at least one wire bonding site inside the integrated circuit package. At least one of these leads is bifurcated, forming a bifurcated lead. The bifurcated lead is joined at its associated external pin and is split in the region near the wire bonding site.

In a further aspect of the invention, the bifurcated lead(s) at its widest point, is wider than the widest point of each of said plurality of leads which are not bifurcated leads.

In another aspect of the invention, the integrated circuit package is of multiple layers and a bifurcated lead is present on at least two layers of the integrated circuit package.

Also shown in an illustrated embodiment of the invention is an integrated circuit package in which at least one of the power supply leads, at its widest part, is significantly wider than any of the other leads which are not power supply leads.

BRIEF DESCRIPTION OF THE DRAWINGS

The aforementioned and other features, characteristics, advantages, and the invention in general, will be better understood from the following, more detailed description taken in conjunction with the accompanying drawings in which:

FIG. 1 is a simplified equivalent circuit of an output driver circuit showing the inductance present in the power supply leads;

FIG. 3 is an equivalent circuit of the logic circuitry and output driver circuit in an integrated circuit chip inside an integrated circuit package illustrating the advantages of the present invention.

Figure 2:
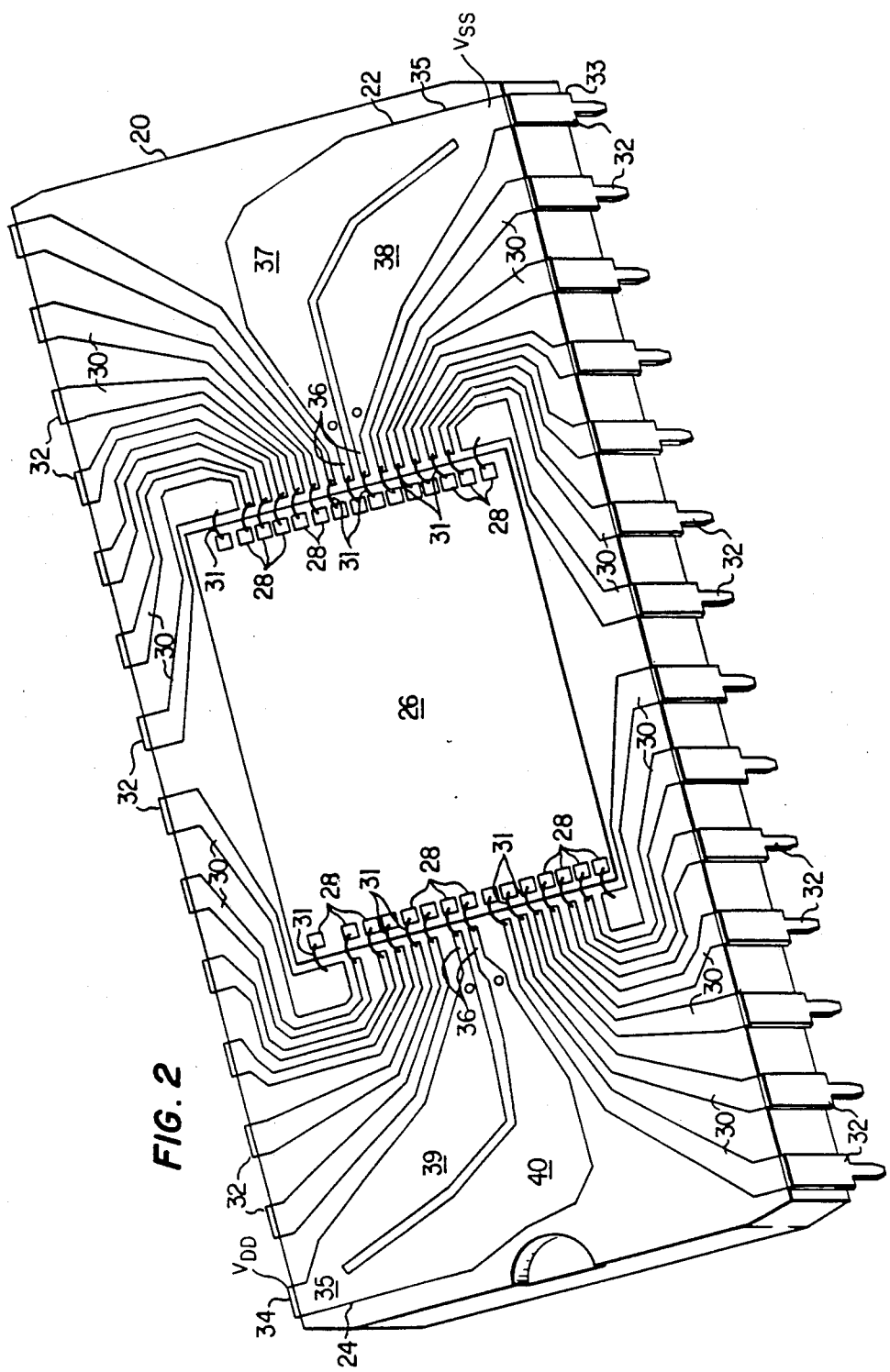
FIG. 2 is an isometric view of an integrated circuit package according to the present invention.

It will be appreciated that for purposes of clarity and where deemed appropriate, reference numerals have been repeated in the figures to indicate corresponding features, and that the drawings have not necessarily been drawn to scale in order to more clearly show important features of the present invention.

DESCRIPTION OF THE PREFERRED EMBODIMENT

The voltage transients arising from the inductance in the conductors between the external power supply pins of an integrated circuit package and the power supply pads on an integrated circuit chip in the package can be significantly lessened by using a bifurcated or split lead in the integrated package between the external pin and the wire bonds connecting the leads to the pads of the integrated circuit chip. The split leads used for the power supply connections are joined at the external pin connection to the lead, but are split so that there is a separate conductive path between the external pin and the power supply pad which provides power supply voltages to the logic circuitry and the conductor which provides power supply voltages to the output driver stages of the integrated circuit chip.

The leads between the external pin and the wire bonds provide the most contribution to the total inductance between the external pins and the pads on the integrated circuit chip, and therefore, the present invention isolates the majority of the voltage transients caused by the output driver stages from the power supply voltages appearing on the power supply pads of the logic circuitry in the integrated circuit chip. Thus, the integrated circuit chip can provide output driver stages which drive relatively large loads with relatively fast rise and fall times without causing significant transients in the power supply voltages to the logic circuitry on the integrated circuit chip. Also, if fast rise and fall times or if driving large external loads is not a requirement of the integrated circuit chip, the present invention would advantageously provide greater worst case noise margins in the logic circuitry of the integrated circuit chip, since the power supply transients arising from the output driver stages are to a large extent isolated from the logic circuitry on the integrated circuit chip.

Turning now to the drawings, FIG. 1 is a simplified equivalent circuit of an output driver stage 10 of an integrated circuit chip which contains an upper p-channel transistor 12 and a lower n-channel transistor 13 to form a commonly used complementary driver circuit 10. The gate of the transistor 12 is connected to an input signal line 14, and the gate of the transistor 13 is connected to an input signal line 15. The output of the driver circuit 10 is connected to a external load capacitance 16. The source of the p-channel transistor 12 is connected to a positive power supply voltage VDD through an inductor 18, and the source of the n-channel transistor 13 is connected to a ground reference through another inductor 20. The inductors 18 and 20 represent the series inductance formed by the external pins of the integrated circuit package, the internal leads in the integrated circuit package, the wire bonds between the internal leads and the pads of the integrated circuit chip, and also any additional inductance arising from the printed circuit board between the external pin of the integrated circuit package and a decoupling capacitor usually located external to the integrated circuit package.

Each of the inductors 18 and 20 has a magnitude on the order of 10 nanohenries. If, for example, an integrated circuit chip has 8 output driver stages, each driving a load of 100 picofarads with a 5 volt swing in four nanoseconds; then the current flowing through either the inductor 18 or the inductor 20 is one ampere. However, a current of one ampere in four nanoseconds through an inductance of 10 nanohenries creates a voltage of 2.5 volts across the inductor. If, in the example, each of the outputs is changing from a high voltage to a low voltage level such that each of the n-channel transistors 13 is switched on or made conductive, the source of each of the n-channel transistors 13 will rise from ground to +2.5 volts. If the gate of each of the n-channel transistors 13 is at 3 volts, and the threshold voltage of the n-channel transistors 13 is 1 volt, then each of the n-channel transistors 13 could become nonconductive during a portion of this transient operation.

More importantly, not only would each of the n-channel transistors 13 have their source voltages raised by 2.5 volts, but each of the other n-channel transistors in the logic circuitry of the integrated circuit chip having their sources tied to the ground pad on the integrated circuit chip would also have their source voltages raised by 2.5 volts, and could become nonconductive during this voltage transient. This could produce logic reversals inside the logic circuitry and create errors in the data. Similarly, when the output of the driver circuits is rising, the p-channel transistors 12 will be conductive, but the sources of the p-channel transistors will change from 5 volts to 2.5 volts. Depending on the gate driving the voltage to the p-channel transistors 12, this could cause the p-channel transistors 12 and the other p-channel transistors in the logic circuitry having their source connected to the VDD pad of the integrated circuit chip to become nonconductive during a portion of the transient switching operation.

FIG. 2 is an isometric view of an integrated circuit package 20 containing bifurcated leads 22 and 24 according to the present invention. Also shown in FIG. 2 is an integrated circuit chip 26 containing a plurality of bonding pads 28 which are electrically connected to the bifurcated leads 22 and 24 and to a plurality of signal leads 30 in the integrated circuit package 20 by means of wire bonds 31. Connected to each of the bifurcated leads 22 and 24 and to the signal leads 30 are a plurality of external pins 32. In the preferred embodiment, the bifurcated lead 22 is connected to an external pin 33 which carries the VSS or ground reference supply voltage used by the integrated circuit chip 26, and the bifurcated lead 24 is connected to an external pin 34 which carries the VDD or positive supply voltage used by the integrated circuit chip 26.

As shown in FIG. 2, each of the bifurcated leads 22 and 24 has a bifurcation or joined portion 35 near the external pins 33 and 34 attached to each of the bifurcated leads 22 and 24 respectively. Each of the bifurcated leads 22 and 24 have two split ends 36 near the integrated circuit chip 26. The bifurcated lead 22 has two branches 37 and 38, each connected between the joined portion 35 and one of the split ends 36. The branch 37 provides a conductive path from the external pin 33 to the wire bond 31 which is connected to the ground reference voltage pad on the integrated circuit chip 26 for the output driver stages 10 of the integrated circuit chip 26. The branch 38 provides a conductive path from the external pin 33 to the wire bond 31 which is connected to the ground reference voltage pad on the integrated circuit chip 26 for circuitry on the integrated circuit chip 26 other than the output driver stages 10. Similarly, the bifurcated lead 24 has two branches 39 and 40, each connected between the joined portion 35 and one of the split ends 36. The branch 39 provides a conductive path from the external pin 34 to the wire bond 31 which is connected to the VDD voltage pad on the integrated circuit chip 26 for the output driver stages 10 of the integrated circuit chip 26. The branch 40 provides a conductive path from the external pin 34 to the wire bond 31 which is connected to the VDD voltage pad on the integrated circuit chip 26 for the circuitry on the integrated circuit chip 26 other than the output driver stages 10.

An equivalent circuit diagram for the integrated circuit package 20 shown in FIG. 2 together with the logic circuitry and output driver stage 10 of the integrated circuit chip 26 is shown in FIG. 3. FIG. 3 also shows a decoupling capacitor 40 which is connected between VDD and ground and is usually external to the integrated circuit package 20. Also connected to VDD is one end of an inductor 42, labeled $L_{PIN}$, which represents the equivalent inductance of the printed circuit board trace between the decoupling capacitor 40 and the external pin 34 and also represents the inductance of the external pin 34 of the integrated circuit package 20 and the joined portion 35 of the bifurcated lead 24. Connected to the other end of the inductor 42 is another inductor 44, labeled as $L_{LEAD}$, which represents the inductance of the branch 40 of the bifurcated lead 24 which conducts the VDD voltage from the external pin 34 to the wire bond 31 and to the logic circuitry of the integrated circuit chip 26. Connected to the other end of the inductor 44 is another inductor 46, labeled $L_{WB}$, which represents the inductance of the wire bond 31 which connects the branch 40 to the pad on the integrated circuit chip 26 which provides VDD voltage to all of the integrated circuit chip 26, except the output driver stages 10, and shown as logic block 48 in FIG. 3. Connected to the other end of the inductor 46 is the logic block 48.

Also connected to the logic block 48 is another inductor 50 labeled $L_{WB}$, which represents the inductance of the wire bond 31 which carries the ground reference voltage connected to the logic circuitry 48 in the integrated circuit chip 26. Connected to the other end of the inductor 50 is another inductor 52, labeled $L_{LEAD}$, which represents the inductance of the branch 38 of the bifurcated lead 22 which conducts the ground reference voltage to the logic circuitry 48. Connected to the other end of the inductor 52 is still another inductor 54, labeled $L_{PIN}$, which represents the inductance of the external pin 33 of the integrated circuit package 20, the inductance of the joined portion 35 of the bifurcated lead 22, and the inductance of the trace on the printed circuit board connected between the external pin 33 and the decoupling capacitor 40. The other end of the inductor 54 is connected to ground.

Also connected to the node formed by the junction of the inductors 42 and 44 is another inductor 56 which represents the inductance of the branch 39 of the bifurcated lead 24. Connected to the other end of the inductor 56 is another inductor 58, labeled $L_{WB}$, which represents the inductance of the wire bond 31 connecting the branch 39 of the bifurcated lead 24 to the pad on the integrated circuit chip connected to the VDD of the output driver circuits 10 on the integrated circuit chip 26.

Also connected to the output driver circuit 10 is another inductor 60, labeled $L_{WB}$, which represents the inductance of the wire bond 31 connecting the branch 37 of the bifurcated lead 22 to the pad on the integrated circuit chip 26 which provides ground to the output driver circuits 10. The other end of the inductor 62 is connected to another inductor 62, labeled $L_{LEAD}$, which represents the inductance of the branch 37 of the bifurcated lead 22. The other end of the inductor 62 is connected to the node formed by the junction of the inductors 52 and 54. An input signal to the driver 10 on line 15 is connected to the output of the logic circuitry 48. The output driver circuitry 10 drives the load capacitor 16.

As shown in the equivalent circuit of FIG. 3, the inductance associated with each of the leads which normally supplies power supply voltage to both the logic circuitry 48 and the output driver circuitry 10 has been split in the bifurcated leads 22 and 24 into two separate lead inductances 44 and 56 for the VDD power supply voltage and into two separate inductances 52 and 62 for the ground reference voltage. Since the inductance of the leads 44, 56, 52, and 62 is much larger than the inductance of either the wire bonds or the external circuitry and printed circuit board traces represented by inductors 42 and 54, the transient voltages induced by the transient currents through the output driver circuits 10 are substantially isolated from the logic circuitry 48, thereby enabling the logic circuitry 48 to preserve its logic states during the transient switching operations.

Stated another way, faster rise and fall times can be generated by the output driver circuitry 10 without affecting the logic states in the logic circuitry 48. Similarly, since the effects of the transient currents arising from the output driver circuits 10 are substantially reduced, the corresponding decrease in the noise margin in the logic circuitry 48 is similarly decreased; and thus, the worst case noise margin within the logic circuitry 48 is improved.

Figure 4A:
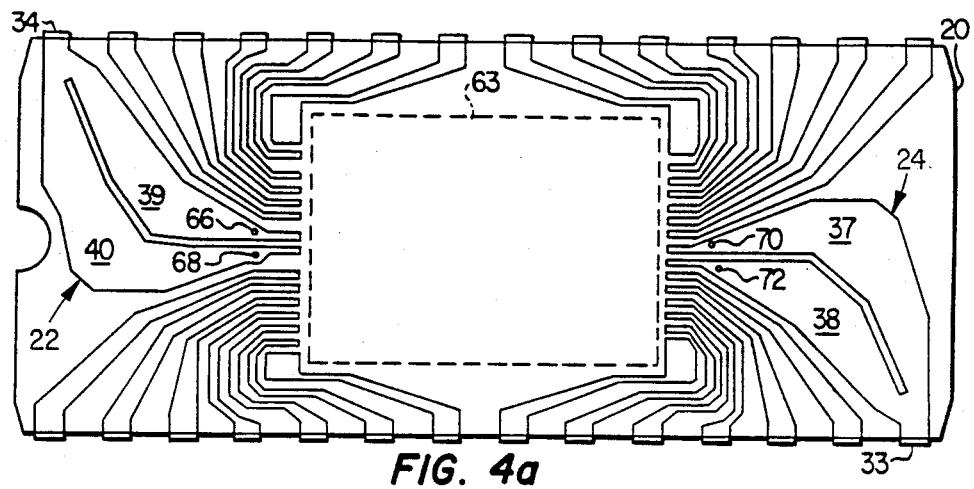
FIG. 4 shows plan views of three layers of a multiple layer integrated circuit package according to the present invention.
Figure 4B:
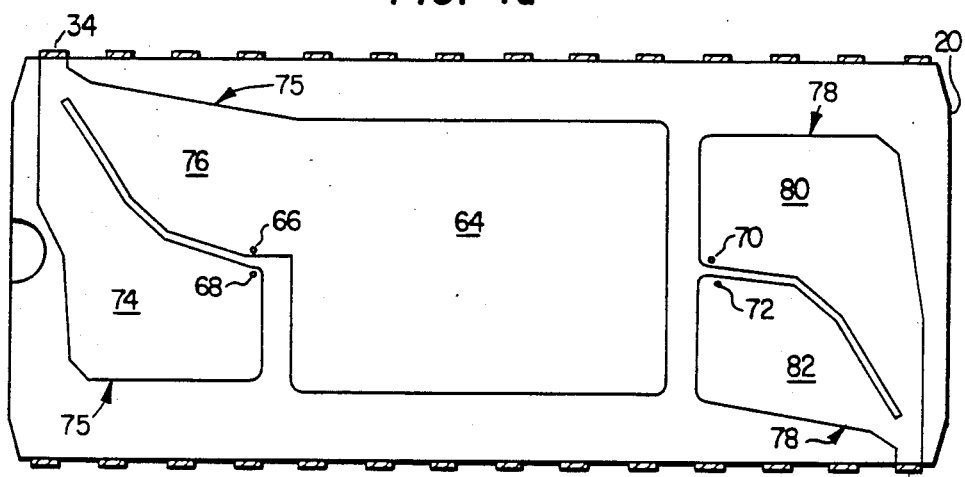
Figure 4C:
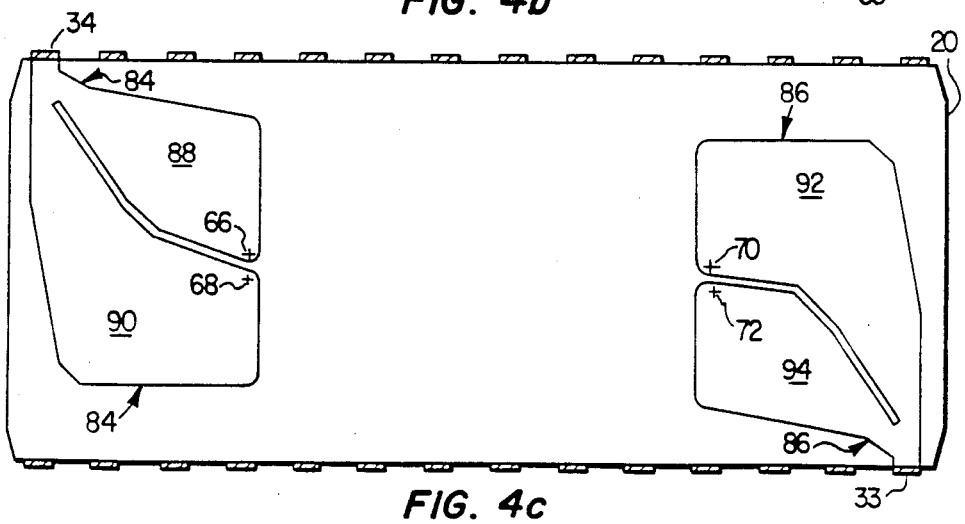

In the preferred embodiment of the invention, the integrated circuit package 20 is a ceramic package in which the bifurcated leads 22 and 24 are placed on three layers of a multi-layer package as shown in FIGS. 4A, 4B, and 4C. FIG. 4A is the top layer of the three layers and includes the bifurcated leads 22 and 24, the signal leads 30. A cutout region, shown by the dotted line 63, accommodates the integrated circuit chip 20 when it is bonded to a die attach site 64 on the next lower layer shown in FIG. 4B. The ends of the leads 22, 24, and 30 are adjacent the die attach site 64 since the integrated circuit chip 26 will be mounted on the die attach site 64. Also shown in FIG. 4A are four feed-through holes 66, 68, 70, and 72 which are located near the ends 36 of the branches 39, 40, 37, and 38 respectively. These feed-through holes provide contact to the layers shown on FIG. 4B and 4C.

FIG. 4B shows a middle layer of the three layers in which a second bifurcated lead 75 is connected to the external pin 34 of the integrated circuit package 20 and has a first branch 74 which extends from the external pin 34 to the feed-through hole 68, and has a second branch 76 which extends from the external pin 34 to the feed-through hole 66 and also is extended to form the die attach site 64. The second bifurcated lead 78 is connected to the external pin 33 and has two branches, a first branch 80 which extends from the external pin 33 to the feed-through hole 70 and a second branch 82 which extends from the external pin 35 to the feed-through hole 72.

The bottom layer of the three layers, shown in FIG. 4C, includes a third set of bifurcated leads 84 and 86. The bifurcated lead 84 is connected to the external pin 34 and has a first branch 88 connected to the feed-through hole 66 and a second branch 90 connected to the feed-through hole 68. The bifurcated lead 86 is connected to the external pin 33 and has a first branch 92 connected to the feed-through hole 70 and a second branch 94 connected to the feed-through hole 72.

Advantageously, the three layers of the bifurcated leads 22, 24, 75, 78, 84, and 86 together with the feed-through holes 66, 68, 70, and 72 provide parallel connections for the bifurcated leads and thereby reduce the series inductance between the external pins 33 and 34 and the wire bonds 31 to the integrated circuit chip 26.

Also the widths of the bifurcated leads, which form the power supply leads, are made significantly greater in comparison to the widths of the other leads 30 in the integrated circuit package 20 in order to further reduce the inductance in the bifurcated leads.

Thus, there has been described a split lead package which isolates and reduces the transients in the power supply lines caused by the output driver circuits of an integrated circuit chip to thereby enable faster rise and fall times from the output driver circuits and to also provide improved worst-case noise margins in the logic circuitry of the integrated circuit chip.

Although the invention has been described in part by making detailed reference to a certain specific embodiment, such detail is intended to be, and will be understood to be, instructional rather than restrictive. It will be appreciated by those skilled in the art that many variations may be made in the structure and mode of operation without departing from the spirit and scope of the invention as disclosed in the teachings contained herein. For example, the bifurcated leads could be further split into leads having three or more branches in order to provide power supply voltages to three or more separate regions on the integrated circuit chip.

What is claimed is:

1. In a multi-layer integrated circuit package having multiple external pins, the improvement comprising:
    first and second bifurcated leads, on separate respective layers of said package, connected in parallel so that each extends from a respective one of said external pins of said integrated circuit package to connect to plural wire bonding sites inside said integrated circuit package,
    said bifurcated leads each having one joined end and multiple split ends, respective ones of said ends of said bifurcated leads being connected in parallel so that
        a first one of said wire bonding sites is connected to a first split end of said first bifurcated lead and to a first split end of said second bifurcated lead,
        a second one of said wire bonding sites is connected to a second split end of said first bifurcated lead and to a second split end of said second bifurcated lead,
        and said respective external pin is connected to said joined end of said first bifurcated lead and to said joined end of said second bifurcated lead.

2. The integrated circuit package as set forth in claim 1, wherein said integrated circuit package includes a die attach site, and wherein said bifurcated leads are routed to couple a power supply voltage from said respective external pin of said integrated circuit package to a chip mounted to said die attach site of said integrated circuit package.

3. The integrated circuit package as set forth in claim 1, further comprising a third bifurcated lead, on a respective layer of said package, which is connected in parallel with said first and second bifurcated leads.

4. A multi-layer integrated circuit package having plural external pins, comprising:
    a plurality of leads individually extending from an external pin respectively associated therewith to one or more wire bonding sites inside said integrated circuit package; and
    wherein at least one of said leads is bifurcated forming a first bifurcated lead, said bifurcated lead being joined at said respective associated pin of said plurality of external pins and being split to make electrical connection to multiple ones of said wire bonding sites;
    and further comprising an additional bifurcated lead, which is located on a different respective layer of said package from said first bifurcated lead, and which is split to make electrical connection to said multiple ones of said wire bonding sites, said additional bifurcated lead being connected in parallel with said first bifurcated lead.

5. The integrated circuit package of claim 4, wherein at least one of said bifurcated leads, at its widest point, is wider than the widest point of each of said plurality of leads which are not bifurcated leads.

6. The integrated circuit package of claim 4, wherein said integrated circuit package includes a die attach site, and wherein said bifurcated leads are routed to couple a power supply voltage from said respectively associated external pin of said integrated circuit package to a chip placed inside said integrated circuit package.

7. The integrated circuit package of claim 4, wherein said additional bifurcated lead is present on at least three layers of said integrated circuit package.

8. The integrated circuit package of claim 7, wherein corresponding ends of said bifurcated leads present on said at least three layers of said integrated circuit package are connected together.

* * * * *